United States Patent
Isa et al.

(10) Patent No.: US 8,394,685 B2
(45) Date of Patent: Mar. 12, 2013

(54) ETCHING METHOD AND MANUFACTURING METHOD OF THIN FILM TRANSISTOR

(75) Inventors: Toshiyuki Isa, Kanagawa (JP); Tomohiro Kimura, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/302,176

(22) Filed: Nov. 22, 2011

(65) Prior Publication Data

US 2012/0156835 A1    Jun. 21, 2012

(30) Foreign Application Priority Data

Dec. 6, 2010   (JP) .................. 2010-271771

(51) Int. Cl.
*H01L 21/8238* (2006.01)
(52) U.S. Cl. ............ 438/149; 438/710; 257/E21.218
(58) Field of Classification Search .......... 438/590, 438/707, 718; 257/E21.37, E21.372, E21.4, 257/E21.457
See application file for complete search history.

(56) References Cited

U.S. PATENT DOCUMENTS

| | | |
|---|---|---|
| 4,409,134 A | 10/1983 | Yamazaki |
| 5,453,858 A | 9/1995 | Yamazaki |
| 5,514,879 A | 5/1996 | Yamazaki |
| 5,571,578 A | 11/1996 | Kaji et al. |
| 5,582,880 A | 12/1996 | Mochizuki et al. |
| 5,591,987 A | 1/1997 | Yamazaki et al. |
| 5,614,732 A | 3/1997 | Yamazaki |
| 5,648,293 A | 7/1997 | Hayama et al. |
| 5,677,236 A | 10/1997 | Saitoh et al. |
| 5,701,167 A | 12/1997 | Yamazaki |
| 5,849,601 A | 12/1998 | Yamazaki |
| 5,859,445 A | 1/1999 | Yamazaki |
| 6,011,277 A | 1/2000 | Yamazaki |
| 6,023,075 A | 2/2000 | Yamazaki |
| 6,153,893 A | 11/2000 | Inoue et al. |
| 6,252,249 B1 | 6/2001 | Yamazaki |

(Continued)

FOREIGN PATENT DOCUMENTS

| | | |
|---|---|---|
| EP | 0535979 A | 4/1993 |
| JP | 04-242724 A | 8/1992 |

(Continued)

OTHER PUBLICATIONS

Arai.T et al., "41.2: Micro Silicon Technology for Active Matrix Oled Display,", SID Digest '07: SID International Symposium Digest of Technical Papers, 2007, vol. 38, pp. 1370-1373.

(Continued)

*Primary Examiner* — Cheung Lee
(74) *Attorney, Agent, or Firm* — Eric J. Robinson; Robinson Intellectual Property Law Office, P.C.

(57) ABSTRACT

The amorphous silicon film is formed over the microcrystalline silicon film, and plasma treatment is performed on the amorphous silicon film in a mixed gas atmosphere of $H_2$ and Ar at a pressure higher than 1000 Pa, so that etching is performed to expose the microcrystalline silicon film. In the etching, the etching rate of the amorphous silicon film and that of the microcrystalline silicon film is large.

14 Claims, 7 Drawing Sheets

U.S. PATENT DOCUMENTS

| | | | |
|---|---|---|---|
| 6,265,288 | B1 | 7/2001 | Okamoto et al. |
| 6,271,055 | B1 | 8/2001 | Yajima et al. |
| 6,281,520 | B1 | 8/2001 | Yamazaki |
| 6,306,213 | B1 | 10/2001 | Yamazaki |
| 6,344,420 | B1 | 2/2002 | Miyajima et al. |
| 6,468,839 | B2 | 10/2002 | Inoue et al. |
| 6,737,676 | B2 | 5/2004 | Yamazaki |
| 6,855,621 | B2 | 2/2005 | Kondo et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,551,655 | B2 | 6/2009 | Tanaka et al. |
| 7,576,360 | B2 | 8/2009 | Yamazaki |
| 7,833,845 | B2 | 11/2010 | Yamazaki et al. |
| 2009/0002591 | A1 | 1/2009 | Yamazaki et al. |
| 2009/0033818 | A1 | 2/2009 | Nakajima et al. |
| 2009/0047759 | A1 | 2/2009 | Yamazaki et al. |
| 2009/0057683 | A1 | 3/2009 | Nakajima et al. |
| 2009/0061574 | A1 | 3/2009 | Nakajima et al. |
| 2009/0072237 | A1* | 3/2009 | Yamazaki et al. ............. 257/72 |
| 2010/0216285 | A1 | 8/2010 | Yokoi et al. |
| 2011/0020989 | A1 | 1/2011 | Tajima et al. |
| 2011/0039402 | A1 | 2/2011 | Yamazaki et al. |
| 2011/0059562 | A1 | 3/2011 | Yamazaki et al. |
| 2011/0121300 | A1 | 5/2011 | Miyairi et al. |
| 2011/0147754 | A1 | 6/2011 | Isa et al. |

FOREIGN PATENT DOCUMENTS

| | | | |
|---|---|---|---|
| JP | 05-129608 | A | 5/1993 |
| JP | 05-275346 | A | 10/1993 |
| JP | 06-077483 | A | 3/1994 |
| JP | 07-045833 | A | 2/1995 |
| JP | 07-131030 | A | 5/1995 |
| JP | 07-162003 | A | 6/1995 |
| JP | 07-211708 | A | 8/1995 |
| JP | 09-232235 | A | 9/1997 |
| JP | 2000-174310 | A | 6/2000 |
| JP | 2000-269201 | A | 9/2000 |
| JP | 2000-277439 | A | 10/2000 |
| JP | 2001-053283 | A | 2/2001 |
| JP | 3201492 | B | 8/2001 |
| JP | 2002-206168 | A | 7/2002 |
| JP | 2002-246605 | A | 8/2002 |
| JP | 2002-280309 | A | 9/2002 |
| JP | 2003-037278 | A | 2/2003 |
| JP | 2004-200345 | A | 7/2004 |
| JP | 2005-049832 | A | 2/2005 |
| JP | 2005-167264 | A | 6/2005 |
| JP | 2005-191546 | A | 7/2005 |
| JP | 2006-237490 | A | 9/2006 |
| JP | 2009-044134 | A | 2/2009 |
| JP | 2009-076753 | A | 4/2009 |
| JP | 2009-088501 | A | 4/2009 |
| JP | 2010-123926 | | 6/2010 |

OTHER PUBLICATIONS

Lee.C et al., "How to Achieve High Mobility Thin Film Transistors by Direct Deposition of Silicon Using 13.56 MHZ RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilites,", Appl. Phys. Lett. (Applied Physics Letters), Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced from Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS with Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 0347305-1-034305-7.

Atkins, "Butsurikagaku (Physical Chemistry), vol. 1, sixth edition" Tokyo Kagaku Dojin (2001) A16, Table 1.3.

* cited by examiner

ETCHING METHOD AND MANUFACTURING METHOD OF THIN FILM TRANSISTOR

BACKGROUND OF THE INVENTION

1. Field of the Invention

The present invention relates to an etching method and a manufacturing method of a thin film transistor.

2. Description of the Related Art

For conventional liquid crystal televisions, amorphous silicon TFTs (thin film transistors) are used in many cases and recognized as structures that can be relatively easily manufactured in terms of manufacturing cost.

However, under current moving image circumstances (e.g., 3D movies or 3D sports broadcast), it is difficult to clearly express moving images with liquid crystal televisions including amorphous silicon TFTs; accordingly, TFTs having high field-effect mobility that can respond at high speed are have been developed. For this reason, a microcrystalline silicon film is under development.

It is known that the field-effect mobility of a thin film transistor in which only a microcrystalline silicon film is employed for a channel formation region is higher than that of an amorphous silicon TFT. On the occasion of employing only a microcrystalline silicon film for a channel formation region for the above-described reason, there is a demand for employing an inverted staggered TFT including a microcrystalline silicon film like the one illustrated in FIG. 7.

A manufacturing method of the inverted staggered TFT illustrated in FIG. 7 is as follows. A gate electrode 102 is formed over a substrate 101, and a gate insulating film 103 is formed over the gate electrode 102. Then, a Si island in which a microcrystalline silicon film 104, an amorphous silicon film 105, and an n+ amorphous silicon film 106 are stacked in this order is selectively formed over the gate insulating film 103, and a conductive film to be processed into a source and drain wirings 110 is formed to cover the Si island.

Next, a resist mask (not shown) is formed over the conductive film, the conductive film is subjected to wet etching using the resist mask as a mask, and the n+ amorphous silicon film 106 is subjected to dry etching. Then, only the amorphous silicon film 105 is subjected to dry etching, so that the microcrystalline silicon film 104 is exposed (e.g., see Patent Document 1). Next, a passivation film 111 is formed over the exposed microcrystalline silicon film 104 and the source and drain wirings 110.

In the case of manufacturing the inverted staggered TFT including the microcrystalline silicon film 104 as a channel formation region in the above-described manner, the n+ amorphous silicon film 106 and the amorphous silicon film 105 need to be etched in a channel etching step. Conventionally, this etching has been carried out using plasma including chlorine or plasma including fluorine with the use of a dry etching apparatus.

However, the difference (and the ratio) between the etching rate of the amorphous silicon film 105 and that of the microcrystalline silicon film 104 is difficult to increase; accordingly, it has been difficult to stop etching at an interface between the microcrystalline silicon film 104 and the amorphous silicon film 105. In other words, there has been a problem in the conventional technique that the microcrystalline silicon film 104 is etched or the amorphous silicon film 105 remains without being completely removed over the substrate plane.

Such a problem is remarkable particularly in the case where a substrate has a large area. This is because in the case of a large-sized substrate, in-plane variation in etching treatment is large and in addition, variations in the film thickness of the amorphous silicon film 105 and the film thickness of the microcrystalline silicon film 104 are also large.

As one means to solve this problem, thickening the microcrystalline silicon film 104 can be considered. However, since the deposition rate of the microcrystalline silicon is particularly lower than that of amorphous silicon, the deposition time is increased in the case of forming the microcrystalline silicon film having a large thickness; as a result, productivity is extremely decreased.

Reference

[Patent Document]

[Patent Document 1] Japanese Published Patent Application No. 2010-123926 (paragraphs 0076 to 0082)

SUMMARY OF THE INVENTION

It is an object of an embodiment of the present invention to provide an etching method or a manufacturing method of a thin film transistor, in which the difference between the etching rate of an amorphous silicon film and that of a microcrystalline silicon film is large.

An embodiment of the present invention is an etching method which includes the step of performing plasma treatment on stacked films of a microcrystalline silicon film over an insulating film and an amorphous silicon film stacked over the microcrystalline silicon film in a mixed gas atmosphere of $H_2$ and Ar at high pressure that is higher than 1000 Pa, so that the microcrystalline silicon film is exposed.

According to the above embodiment, by the plasma treatment in a mixed gas atmosphere of $H_2$ and Ar at a pressure higher than 1000 Pa, the difference between the etching rate of the amorphous silicon film and that of the microcrystalline silicon film can be increased.

Another embodiment of the present invention is a manufacturing method of a thin film transistor, which includes the steps of forming a gate electrode over a substrate, forming a gate insulating film over the gate electrode; forming a microcrystalline silicon film over the gate insulating film; forming an amorphous silicon film over the microcrystalline silicon film; and performing plasma treatment on the amorphous silicon film in a mixed gas atmosphere of $H_2$ and Ar at a pressure higher than 1000 Pa, so that the microcrystalline silicon film is exposed.

Another embodiment of the present invention is a manufacturing method of a thin film transistor, which includes the steps of forming a gate electrode over a substrate, forming a gate insulating film over the gate electrode; forming a microcrystalline silicon film over the gate insulating film; forming an amorphous silicon film over the microcrystalline silicon film; forming an impurity silicon film over the amorphous silicon film; forming a conductive film over the impurity silicon film; etching the conductive film and the impurity silicon film, so that a source wiring and a drain wiring are formed from the conductive film and the amorphous silicon film is exposed; and performing plasma treatment on the exposed amorphous silicon film in a mixed gas atmosphere of $H_2$ and Ar at a pressure higher than 1000 Pa, so that the microcrystalline silicon film is exposed.

DETAILED DESCRIPTION OF THE INVENTION

Hereinafter, embodiment of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiment.

[Experimental Verification]

Results of experimental verification that plasma treatment in a mixed gas atmosphere of $H_2$ and Ar at a pressure higher than 1000 Pa is effective in order to make a difference between the etching rate of an amorphous silicon film and that of a microcrystalline silicon film large will be described.

First, an amorphous silicon film and a microcrystalline silicon film were formed as below.

(Deposition Conditions of an Amorphous Silicon Film)
  Flow rate: $SiH_4/H_2$=280 sccm/330 sccm
  Pressure: 170 Pa
  RF power: 60 W
  Distance between electrodes (Distance between a lower surface of an upper electrode and an upper surface of a lower electrode): 24.5 mm
  Substrate temperature: 280° C.
  Deposition rate: 23 nm/min.

(Deposition Conditions of a Microcrystalline Silicon Film)
  Flow rate: $SiH_4/H_2/Ar$=10 sccm/1500 sccm/1500 sccm
  Pressure: 280 Pa
  RF power: 50 W
  Distance between electrodes (Distance between a lower surface of an upper electrode and an upper surface of a lower electrode): 24.5 mm
  Substrate temperature: 280° C.
  Deposition rate: 1.71 nm/min.

The amorphous silicon film and the microcrystalline silicon film were each subjected to plasma treatment under the conditions described below in a vacuum chamber of a parallel-plate plasma treatment apparatus.

Figure 1:
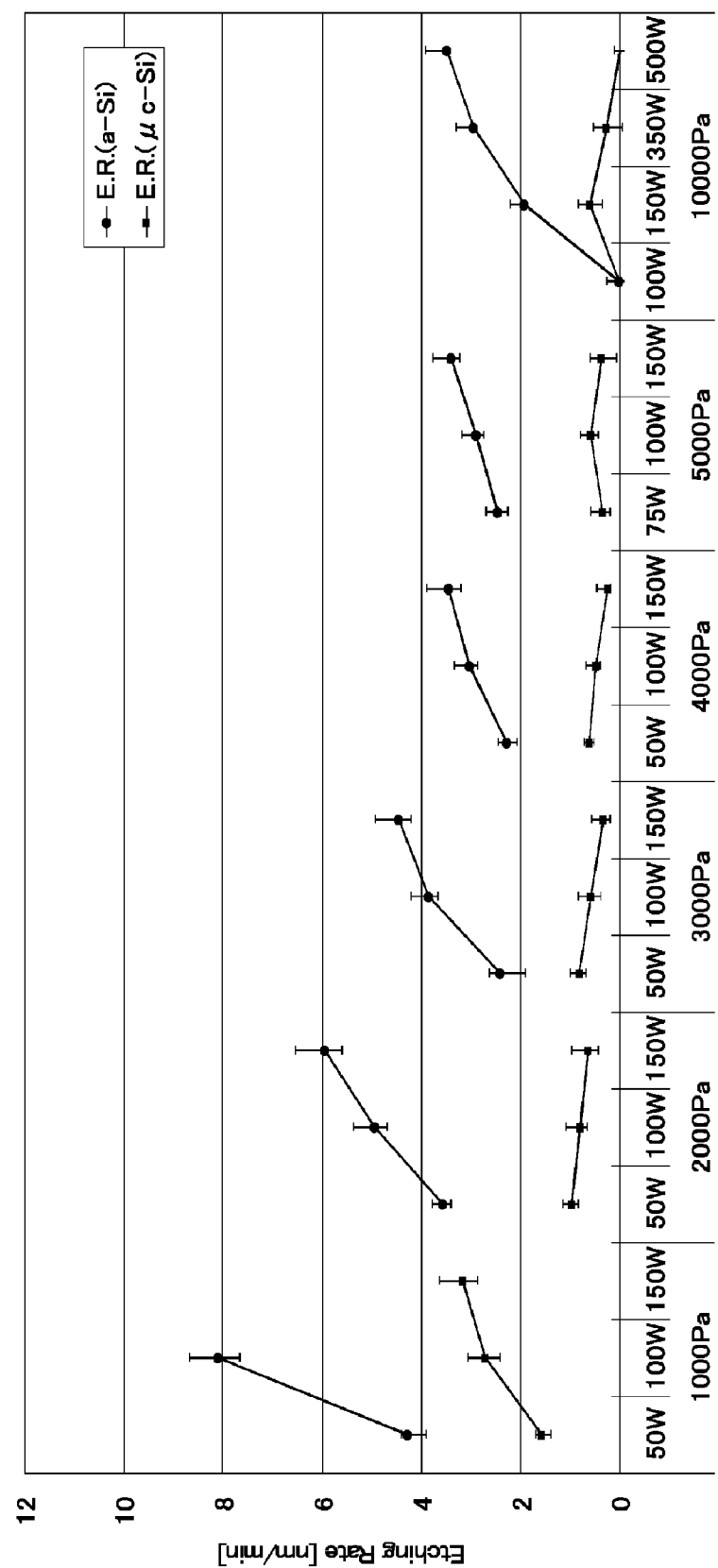
FIG. 1 shows changes in the etching rate of an amorphous silicon film and the etching rate of a microcrystalline silicon film.

(Conditions)
  Flow rate of $H_2$: 1500 sccm
  Flow rate of Ar: 1500 sccm
  Pressure: 1000 Pa, 2000 Pa, 3000 Pa, 4000 Pa, 5000 Pa, and 10000 Pa
  Distance between electrodes (Distance between a lower surface of an upper electrode and an upper surface of a lower electrode): 7 mm
  Upper electrode temperature: 250° C.
  Lower electrode temperature: 290° C.
  RF power frequency: 13.56 MHz
  RF power: 50 W, 100 W, 150 W
  Treatment time: 600 sec FIG. 1 shows changes in the etching rate of the amorphous silicon film and the etching rate of the microcrystalline silicon film under the above conditions. FIG. 1 shows a relation among the pressure, the RF power, and the etching rate.

In FIG. 1, at a pressure of 1000 Pa, as the RF power was increased, both the etching rate of the amorphous silicon film and the etching rate of the microcrystalline silicon film were increased. Further, at a pressure of 2000 Pa, as the RF power was increased, the etching rate of the amorphous silicon film was increased but the etching rate of the microcrystalline silicon film was decreased.

From these results, it can be said that only the amorphous silicon film can be etched without most part of the microcrystalline silicon film etched by setting, for example, the pressure at 3000 Pa and the RF power at 150 W.

[Consideration Based on the Scientific Computation Results]

Next, consideration of the reason why the plasma treatment in a mixed gas atmosphere of $H_2$ and Ar at a pressure higher than 1000 Pa is effective in order to make a difference between the etching rate of an amorphous silicon film and that of a microcrystalline silicon film large will be described based on the scientific computation results.

Figure 2:
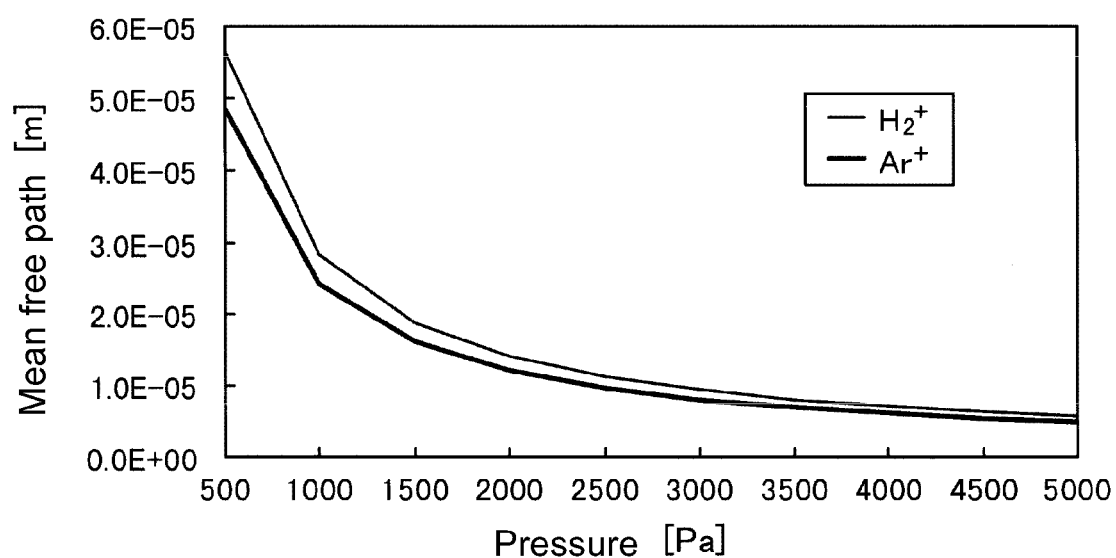
FIG. 2 shows a relation between the mean free paths of $H_2^+$ and $Ar^+$ and the pressure.

First, a possible direct effect of the high pressure condition is a significant decrease of the mean free paths of particles in the vacuum chamber. Here, the mean free paths of $H_2^+$ and $Ar^+$ at the time when the pressure in deposition of the microcrystalline silicon film was changed were calculated based on the scientific computation in the following manner and the scientific computation results are shown in FIG. 2.

(Calculation of the Mean Free Path)

Supposing that the particles are rigid bodies and the collision radius of a particle 1 is $d_1$ (m) and the collision radius of a particle 2 is $d_2$ (m), the collision cross section $\sigma(m^2)$ can be expressed by the following formula.

$$\sigma = \pi(d_1+d_2)^2$$

In general, in the case where an approximation that a test particle (1) travels through collision with a stationary particle (2) holds (e.g., in the case of electron-neutral particle collision), the mean free path $\lambda_{12}$ is expressed by the following formula. Note that n is the density of particles (2).

$$\lambda_{12} = 1/(n\sigma)$$

An ion that is accelerated by the sheath electric field is much faster than the neutral particle; accordingly, the ion can be considered as the particle (1) and the neutral particle can be considered as the particle (2). Here, the mean free path of an ion for a gas used in deposition of the microcrystalline silicon film was calculated on the assumption that the ratio of the gas flow rate is proportional to the partial pressure. The calculation here was conducted in the following conditions.

The flow rates of $SiH_4/H_2/Ar$ (sccm)=1.5/750/750
  The pressure inside the chamber (Pa)=500-5000
  The temperature inside the chamber=280° C. (553 K)

Calculation was conducted on the assumption that the mixed gas of $SiH_4$, $H_2$, and Ar is un-ionized positive charge. Note that in the case where one of the particles is not regarded as being stationary, the relative velocity is increased and the number of collisions in a unit of time is increased; as a result, the mean free path is decreased.

TABLE 1

| Collision cross section |      |
|---|---|
| | $\sigma/nm^2$ |
| $H_2$ | 0.27 |
| Ar | 0.36 |

*) Atkins, "Butsurikagaku (Physical Chemistry), vol. 1, sixth edition" Tokyo Kagaku Dojin (2001)

Table 1 shows parameters used in the scientific computation. FIG. 2 shows scientific computation results of the mean free paths of $H_2^+$ and $Ar^+$ at the time when the pressure in deposition of the microcrystalline silicon film was changed. According to FIG. 2, the mean free paths are drastically decreased between 1000 Pa and 3000 Pa. Above a pressure of 3000 Pa, the mean free paths are gradually decreased for an increase in the pressure.

(Etching)

Etching of the microcrystalline silicon film is considered next. It is considered that collision of ionized hydrogen ions ($H^+$, $H_2^+$, $H_3^+$) or $Ar^+$ with the microcrystalline silicon film causes lattice mismatch and thereby etching in an amorphous portion is promoted fast. The energy distribution function of ions generated under high pressure was obtained by scientific computation. The results are shown in FIG. 3 and FIG. 4.

Figure 3:
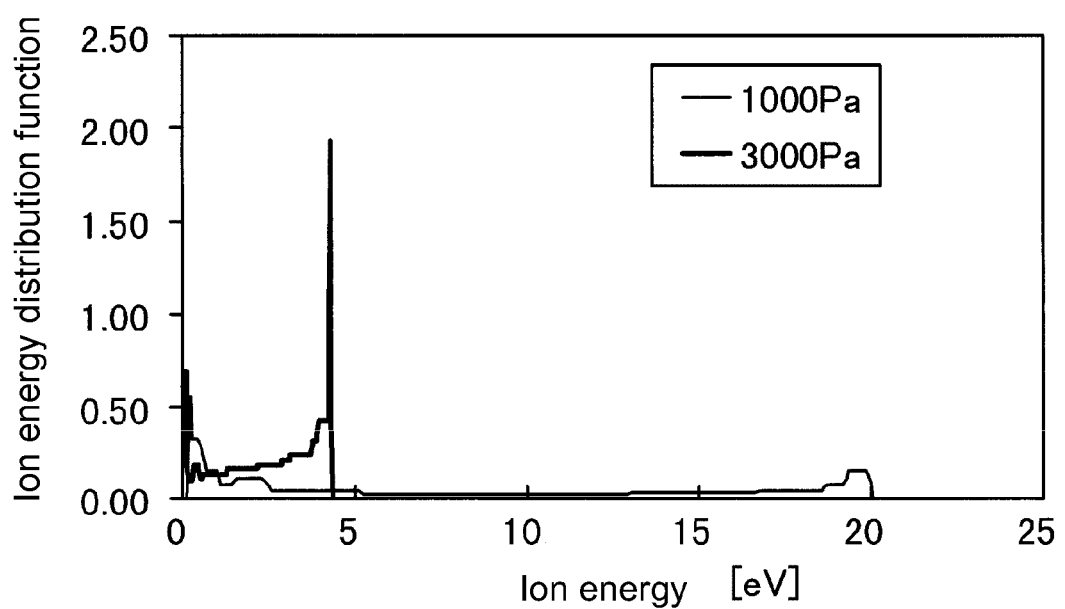
FIG. 3 shows the ion energy distribution function of $H_2^+$ at 1000 Pa and 3000 Pa.

FIG. 3 shows the ion energy distribution functions of $H_2^+$ at 1000 Pa and 3000 Pa. According to FIG. 3, at 1000 Pa, ions having high energy up to and including 20 eV exist and thus a wide energy distribution is exhibited. However, at 3000 Pa, high distribution is exhibited on the low energy side and only ions having an energy of 5 eV or less exist. It can be considered that this is because the mean free path of ions is decreased under high pressure as described above and thus an ion accelerated by an electric field collides with another ion immediately, so that enough kinetic energy cannot be obtained.

Figure 4:
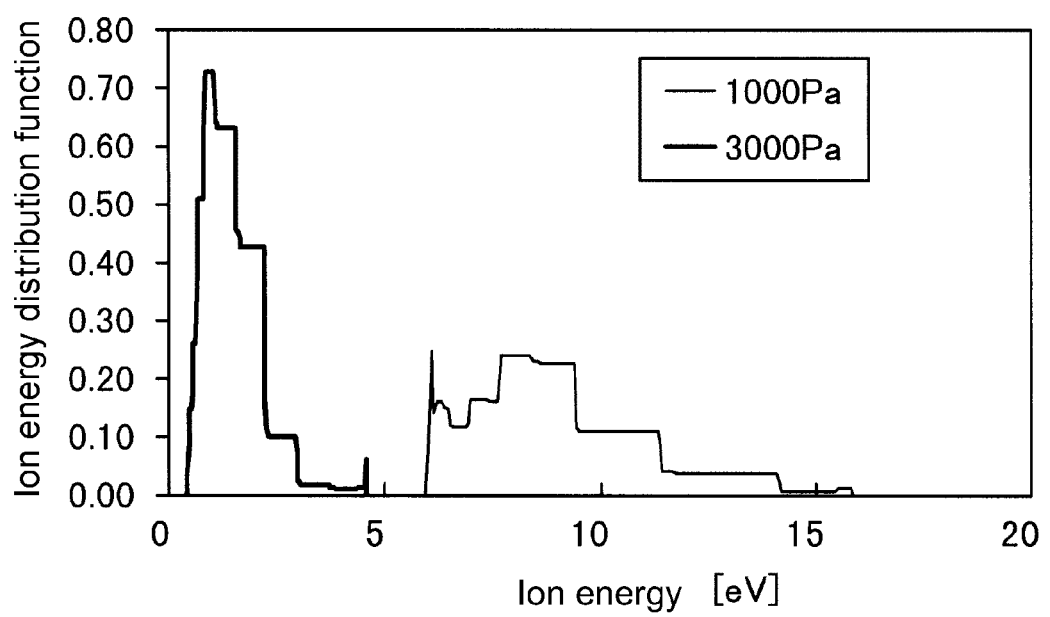
FIG. 4 shows the ion energy distribution function of $Ar^+$ at 1000 Pa and 3000 Pa.

FIG. 4 shows the ion energy distribution functions of $Ar^+$ at 1000 Pa and 3000 Pa. Similarly in FIG. 4, at 1000 Pa, ions having high energy exist and a wide energy distribution is exhibited, while at 3000 Pa, high distribution is exhibited on the low energy side less than 5 eV.

The above results prove that by the plasma treatment in a mixed gas atmosphere of $H_2$ and Ar at a pressure higher than 1000 Pa, the mean free path of ions is decreased and accordingly the ion energy is lowered. It can be considered that in etching of the microcrystalline silicon film, change of the microcrystals into amorphous state made due to ion damage promotes the etching. Therefore, it can be considered that since ion damage is reduced in the plasma treatment in a mixed gas atmosphere of $H_2$ and Ar at a pressure higher than 1000 Pa, the etching rate of the microcrystalline silicon film is lowered.

On the other hand, the etching rate of the amorphous silicon film is increased for an increase in the RF power even at a pressure higher than 1000 Pa, unlike the etching rate of the microcrystalline silicon film. It can be considered that this is because the amorphous silicon film is etched mainly by hydrogen radicals and etching can proceed even without ion damage unlike in the microcrystalline silicon film. Therefore, it can be considered that the amount of generated hydrogen radicals is increased in accordance with an increase in the RF power even at high pressure, and the etching rate of the amorphous silicon film is also increased.

[Manufacturing Method of a TFT]

Next, a manufacturing method of a TFT using the technique described above, "the plasma treatment in a mixed gas atmosphere of $H_2$ and Ar at a pressure higher than 1000 Pa," will be described. This manufacturing method of a TFT is an example of a process for manufacturing an inverted staggered TFT including a microcrystalline silicon film, which will be described with reference to FIGS. 5A to 5C and FIGS. 6A and 6B.

Figure 5A:
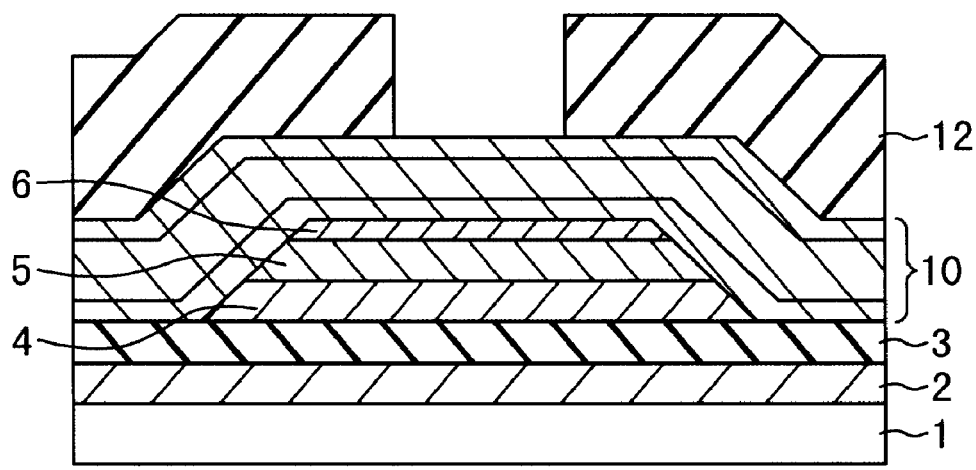
FIGS. 5A to 5C are cross-sectional views illustrating a manufacturing method of an inverted staggered TFT including a microcrystalline silicon film according to an embodiment of the present invention.

First, as illustrated in FIG. 5A, a gate electrode 2 is selectively formed over a substrate 1. Then, a gate insulating film 3 that is, for example, formed of a silicon nitride film (an $SiN_x$ film) is formed covering the gate electrode 2. Note that an example of a formation method of the $SiN_x$ film is as follows.

Flow rate: $SiH_4/NH_3/N_2/H_2$=15 sccm/500 sccm/180 sccm/200 sccm
Pressure: 100 Pa
RF power: 200 W
Distance between electrodes (Distance between a lower surface of an upper electrode and an upper surface of a lower electrode): 30 mm
Substrate temperature: 250° C.

Next, $N_2O$ plasma treatment is performed on a surface of the gate insulating film 3. Note that although the $N_2O$ plasma treatment is used in the present manufacturing method, plasma treatment in $H_2O$, plasma treatment in a mixed gas of $H_2$ and $O_2$, or plasma treatment in $O_2$ may be used as well. Note that the $N_2O$ plasma treatment is performed, for example, as follows.

Flow rate: $N_2O$=400 sccm
Pressure: 60 Pa
RF power: 300 W
Distance between electrodes (Distance between a lower surface of an upper electrode and an upper surface of a lower electrode): 30 mm As the substrate 1, a glass substrate, a ceramic substrate, or the like can be used. Note that there is no limitation on the size of the substrate 1. For example, any of glass substrates of the 3rd to 10th generations which are often used in the field of flat panel displays can be used.

The gate electrode 2 can be formed in the following manner: a conductive film is formed over the substrate 1 by a sputtering method or a vacuum evaporation method using any of metal materials selected from Mo, Ti, Cr, Ta, W, Al, Cu, Nd, Sc, or Ni; a mask is formed over the conductive film by a photolithography method; and the conductive film is etched using the mask. In order to improve adhesion between the gate electrode 2 and the substrate 1, a film of a nitride of any of the above-described metal materials may be provided between the substrate 1 and the gate electrode 2. In this embodiment, a conductive film is formed over the substrate 1 and etched using a resist mask formed by a photolithography method.

Note that a side surface of the gate electrode 2 preferably has a tapered shape. This is because an insulating film, a silicon film, and a wiring formed over the gate electrode 2 in later steps can be prevented from being cut at a step portion of the gate electrode 2. In order to form the gate electrode 2 to have a tapered shape, etching may be performed while the resist mask is made to recede.

For example, the gate insulating film 3 may be formed as a single layer or a stacked layer using a silicon nitride film (a $SiN_x$ film) or a silicon nitride oxide film (a SiNO film) by a CVD method, a sputtering method, or the like.

Next, a microcrystalline silicon film 4 is formed over the gate insulating film 3 (FIG. 5A). For example, the microcrystalline silicon film 4 is formed of a first microcrystalline silicon film and a second microcrystalline silicon film formed thereover.

The thickness of the first microcrystalline silicon film is preferably greater than or equal to 1 nm and less than or equal to 10 nm. The first microcrystalline silicon film is formed in a treatment chamber of a plasma CVD apparatus, using plasma generated by glow discharge with the use of a mixture of a deposition gas containing silicon and hydrogen as a source gas. Alternatively, the first microcrystalline silicon film is formed using plasma generated by glow discharge with the use of a mixture of a deposition gas containing silicon, hydrogen, and a rare gas such as helium, neon, or krypton. Note that the distance between an upper electrode and a lower electrode of the plasma CVD apparatus may be set to be a distance that enables generation of plasma. As typical examples of the deposition gas containing silicon, there are $SiH_4$, $Si_2H_6$, and the like.

In the case where a rare gas such as helium, argon, neon, krypton, or xenon is mixed into the source gas of the first microcrystalline silicon film, the deposition rate of the first microcrystalline silicon film can be increased. Moreover, in the case where ionization or excitation in plasma is promoted by mixing the rare gas and the deposition rate is increased due to promoted decomposition of the $SiH_4$ or $H_2$ gas, the amount of impurities mixed into the first microcrystalline silicon film is reduced, so that the crystallinity of the first microcrystalline silicon film can be increased. Furthermore, the increase in the deposition rate decreases the amount of elements which inhibit crystallization mixed in the film, thereby increasing the crystallinity. Accordingly, an on-state current and field-effect mobility of the thin film transistor are increased and throughput of the thin film transistor can also be increased.

In the glow discharge at the time of forming the first microcrystalline silicon film, the plasma is generated by application of high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. It is preferable to determine the power for generating the plasma as appropriate in accordance with the ratio of the flow rate of hydrogen to the flow rate of the deposition gas containing silicon.

Note that an example of a formation method of the first microcrystalline silicon film is as follows.

Flow rate: $SiH_4/H_2/Ar$=4 sccm/750 sccm/750 sccm
Pressure: 532 Pa
RF power: 150 W
Distance between electrodes (Distance between a lower surface of an upper electrode and an upper surface of a lower electrode): 15 mm
Substrate temperature: 250° C.

The thickness of the second microcrystalline silicon film is preferably greater than or equal to 30 nm and less than or equal to 100 nm. The second microcrystalline silicon film is formed in a treatment chamber of a plasma CVD apparatus, using plasma generated by glow discharge with the use of a mixture of a deposition gas containing silicon and hydrogen as a source gas. Alternatively, the second microcrystalline silicon film is formed using plasma generated by glow discharge with the use of a mixture of a deposition gas containing silicon, hydrogen, and a rare gas such as helium, neon, or krypton. Note that the distance between an upper electrode and a lower electrode of the plasma CVD apparatus may be set to be a distance that enables generation of plasma.

In the case where a rare gas such as helium, argon, neon, krypton, or xenon is mixed into the source gas of the second microcrystalline silicon film, the crystallinity of the second microcrystalline silicon film can be increased in a manner similar to that of the first microcrystalline silicon film. Furthermore, the increase in the deposition rate decreases the amount of elements which inhibit crystallization mixed in the film, thereby increasing the crystallinity. Accordingly, an on-state current and field-effect mobility of the thin film transistor are increased and throughput of the thin film transistor can also be increased.

The condition for generating plasma by glow discharge at the time of forming the first microcrystalline silicon film can be employed as appropriate for the second microcrystalline silicon film. In the case where the condition for generating plasma by glow discharge at the time of forming the first microcrystalline silicon film and that at the time of forming the second microcrystalline silicon film are the same, throughput can be increased; however, they may be different from each other.

Note that an example of a formation method of the second microcrystalline silicon film is as follows.

Flow rate: $SiH_4/H_2/Ar$=1.8 sccm/750 sccm/750 sccm
Pressure: 5000 Pa
RF power: 125 W
Distance between electrodes (Distance between a lower surface of an upper electrode and an upper surface of a lower electrode): 7 mm
Substrate temperature: 250° C.

In this embodiment, the second microcrystalline silicon film is a film which has low adhesion to a base and has a high field-effect mobility as compared to the first microcrystalline silicon film.

The first microcrystalline silicon film and the second microcrystalline silicon film are formed of microcrystalline silicon. Note that microcrystalline silicon is a semiconductor having an intermediate structure between an amorphous structure and a crystalline structure (including single crystal and polycrystal). In the microcrystalline silicon, columnar or needle-like crystals having a grain size of 2 nm to 200 nm, preferably 10 nm to 80 nm, further preferably 20 nm to 50 nm, still further preferably 25 nm to 33 nm have grown in a direction normal to the substrate surface. Therefore, there are some cases in which a crystal grain boundary is formed at the interface between the columnar or needle-like crystal grains.

The Raman spectrum of microcrystalline silicon is shifted to a smaller wavenumber side than 520 $cm^{-1}$ that represents single crystal silicon. That is, the peak of the Raman spectrum of the microcrystalline silicon exists between 520 $cm^{-1}$ which represents single crystal silicon and 480 $cm^{-1}$ which represents amorphous silicon. The microcrystalline silicon includes at least 1 at. % or more of hydrogen or halogen to terminate a dangling bond.

Next, an amorphous silicon film 5 is formed over the microcrystalline silicon film 4 (FIG. 5A). The amorphous silicon film 5 includes a region in which crystallization is suppressed.

The amorphous silicon film 5 is formed in a treatment chamber of the plasma CVD apparatus, using plasma generated by glow discharge with the use of a mixture of a deposition gas containing silicon, hydrogen, and a gas containing nitrogen. As examples of the gas containing nitrogen, there are ammonia, nitrogen, nitrogen fluoride, nitrogen chloride, and the like. Generation of plasma by glow discharge can be performed in a manner similar to that of the first microcrystalline silicon film.

In that case, the flow rate ratio of hydrogen to the deposition gas containing silicon is set to a ratio for forming a microcrystalline silicon film in a manner similar to that in forming the first microcrystalline silicon film or the second microcrystalline silicon film, and the gas containing nitrogen is further used as a source gas, whereby crystal growth can be suppressed as compared to the deposition conditions for the first microcrystalline silicon film and the second microcrystalline silicon film. Specifically, a gas containing nitrogen is included in the source gas in deposition of the amorphous silicon film 5, which suppresses crystal growth; thus, a region in which crystallization is suppressed is formed. Accordingly, in the amorphous silicon film 5, a region in which crystallization is suppressed which is formed using a relatively well-ordered silicon film having fewer defects and a steep tail of a level at a valence band edge, can be formed.

Here, a typical example of a condition for forming the amorphous silicon film 5 is as follows: the flow rate of hydrogen is 10 times to 2000 times, preferably 10 times to 200 times that of the deposition gas containing silicon. Note that in a typical example of a condition for forming a normal amorphous silicon film, the flow rate of hydrogen is 0 times to 5 times that of the deposition gas containing silicon.

In the case where a rare gas such as helium, neon, argon, xenon, or krypton is mixed into the source gas of the amorphous silicon film 5, ionization or excitation in plasma is promoted and decomposition of the $SiH_4$ or $H_2$ gas is promoted, whereby the deposition rate can be increased.

It is preferable for the amorphous silicon film 5 to have a thickness of 50 nm to 350 nm, and further preferable to have a thickness of 120 nm to 250 nm.

Next, for example, an $n^+$ amorphous silicon film is formed as an impurity silicon film 6 over the amorphous silicon film 5 (FIG. 5A).

The impurity silicon film 6 is formed using amorphous silicon to which phosphorus is added, microcrystalline silicon to which phosphorus is added, or the like. The structure in which amorphous silicon to which phosphorus is added and microcrystalline silicon to which phosphorus is added are stacked may be employed. In the case of forming a p-channel thin film transistor as a thin film transistor, the impurity silicon film 6 is formed using microcrystalline silicon to which boron is added, amorphous silicon to which boron is added, or the like.

The impurity silicon film 6 is formed in a treatment chamber of the plasma CVD apparatus, using plasma generated by glow discharge with the use of a mixture of a deposition gas containing silicon, hydrogen, and phosphine (diluted with hydrogen or silane) as a source gas. The deposition gas containing silicon is diluted with hydrogen, in formation of amorphous silicon to which phosphorus is added or microcrystalline silicon to which phosphorus is added. In the case of manufacturing a p-channel thin film transistor, the impurity silicon film 6 may be formed using plasma generated by glow discharge using diborane instead of phosphine.

Next, a resist mask (not shown) is formed over the impurity silicon film 6. This mask can be formed by a photolithography step. Using this mask, the microcrystalline silicon film 4, the amorphous silicon film 5, and the impurity silicon film 6 are etched. By this step, the microcrystalline silicon film 4, the amorphous silicon film 5, and the impurity silicon film 6 are divided into elements; thus, a silicon island is selectively formed. Then, the resist mask is removed.

Next, a conductive film that includes, for example, a metal is formed over the silicon island. This conductive film is formed by a CVD method, a sputtering method, or a vacuum evaporation method.

Then, a resist mask 12 is formed by a photolithography step (FIG. 5A).

Figure 5B:
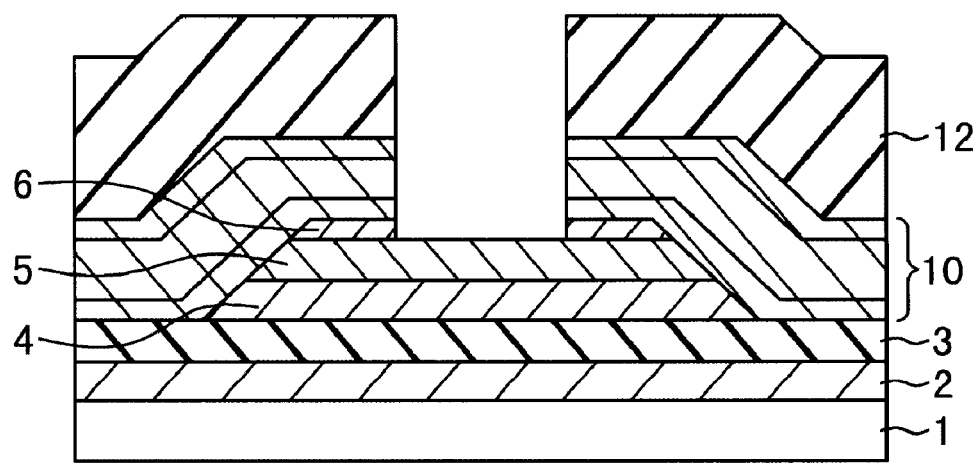

Next, as illustrated in FIG. 5B, the conductive film and the impurity silicon film 6 are subjected to dry etching using the mask 12 to form a source and drain wirings 10 functioning as a source and drain electrodes and a pair of impurity silicon films functioning as a source and drain regions. At this time, the amorphous silicon film 5 is also etched unintentionally, and in-plane variation of the dry etching directly leads to variation in the thickness of the amorphous silicon film 5.

Although the conductive film and the impurity silicon film 6 are subjected to dry etching using the mask 12 in this embodiment, a method may be employed in which the conductive film is subjected to wet etching using the mask 12 and then the impurity silicon film 6 is subjected to dry etching.

One of the source and drain wirings 10 functions as not only a source or drain electrode but also a signal line. However, without limitation thereto, a signal line may be provided separately in addition to the source and drain electrodes. The source and drain wirings 10 can be formed as a stacked layer using any of aluminum, copper, titanium, neodymium, scandium, molybdenum, chromium, tantalum, tungsten, or the like, or may be formed as a single layer as well. Alternatively, an aluminum alloy to which an element to prevent a hillock is added (e.g., an Al—Nd alloy which can be used for the gate electrode) may be used. Alternatively, crystalline silicon to which an impurity element which serves as a donor is added may be used. Further, the source and drain wirings 10 may have a stacked-layer structure obtained as follows; a layer, which is in contact with crystalline silicon to which an impurity element serving as a donor is added, is formed using titanium, tantalum, molybdenum, tungsten, or nitride of any of these elements, and then aluminum or an aluminum alloy is formed thereover. Further alternatively, the source and drain wirings 10 may have a stacked-layer structure in which upper and lower surfaces of aluminum or an aluminum alloy are sandwiched between layers of any of titanium, tantalum, molybdenum, tungsten, or nitride of any of these elements.

Figure 5C:
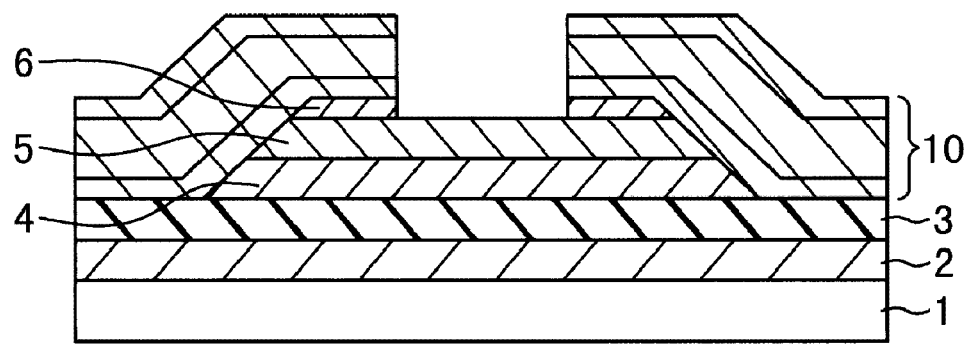

Next, as illustrated in FIG. 5C, the mask 12 is removed with a resist stripper.

Figure 6A:
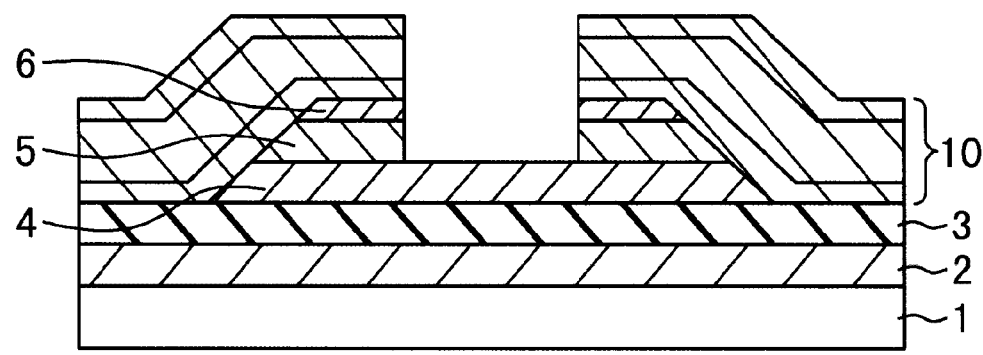
FIGS. 6A and 6B are cross-sectional views illustrating a manufacturing method of an inverted staggered TFT including a microcrystalline silicon film according to an embodiment of the present invention.

Then, the amorphous silicon film 5 is subjected to the above-described plasma treatment in a mixed gas atmosphere of $H_2$ and Ar at a pressure higher than 1000 Pa using the source and drain wirings 10 as a mask, so that the microcrystalline silicon film 4 is exposed as illustrated in FIG. 6A. That is, the amorphous silicon film 5 is etched by the plasma treatment in a mixed gas atmosphere of $H_2$ and Ar with a PECVD apparatus that is capable of treatment at a pressure higher than 1000 Pa.

Since the etching rate of the microcrystalline silicon film 4 is extremely low compared to that of the amorphous silicon film 5 in this etching as described above, the problem of variation in the thickness of the microcrystalline silicon film 4 does not occur. In other words, since the difference between the etching rate of the amorphous silicon film 5 and that of the microcrystalline silicon film 4 can be made large as described above, etching can be easily stopped at an interface between the microcrystalline silicon film 4 and the amorphous silicon film 5; accordingly, problems of the conventional technique such as excessive etching of the microcrystalline silicon film 4 and incomplete removal of the amorphous silicon film 5 over the substrate can be prevented. Such problems can be prevented even in the case of a large-sized substrate in which in-plane variation caused by etching treatment is large or a large-sized substrate in which variation in the thickness of the amorphous silicon film 5 and the thickness of the microcrystalline silicon film 4 is large.

Next, dry etching may be performed. As a condition for the dry etching, a condition in which the exposed microcrystalline silicon film 4 and the exposed amorphous silicon film 5 are not damaged and in which the etching rate of the microcrystalline silicon film 4 and the amorphous silicon film 5 is low is used. That is, a condition in which surfaces of the exposed microcrystalline silicon film 4 and the exposed amorphous silicon film 5 are hardly damaged and in which the thicknesses of the exposed microcrystalline silicon film 4 and the exposed amorphous silicon film 5 are hardly reduced is used. As an etching gas, $Cl_2$, $CF_2$, or the like is typically used. Alternatively, plasma treatment in an $N_2$ gas is performed.

Then, plasma treatment is performed on surfaces of the microcrystalline silicon film 4 and the amorphous silicon film 5.

As described above, the further dry etching under a condition in which the microcrystalline silicon film 4 and the amorphous silicon film 5 are not damaged after the formation of the microcrystalline silicon film 4 and the amorphous silicon film 5 can remove impurities such as residues existing on the exposed microcrystalline silicon film 4 and the exposed amorphous silicon film 5. Moreover, the plasma treatment can ensure insulation between the source region and the drain region, which reduces the off-state current of the completed thin film transistor; accordingly, variation in electrical characteristics can be reduced.

Figure 6B:
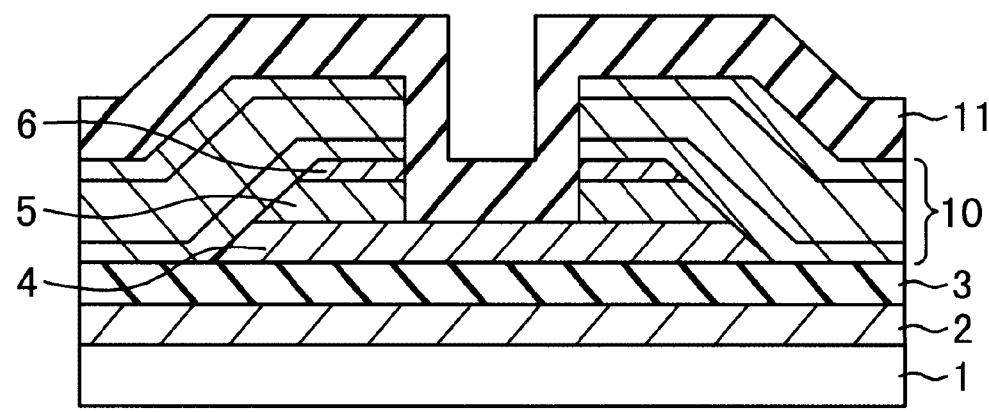
Figure 7:
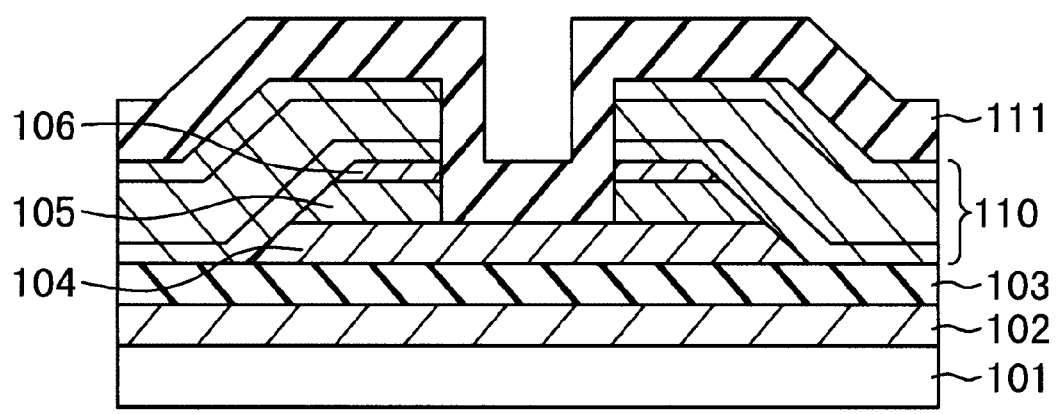
FIG. 7 illustrates a manufacturing method of a conventional inverted staggered TFT.

Next, as illustrated in FIG. 6B, a passivation film (an $SiN_x$ film) 11 is formed to cover the exposed microcrystalline silicon film 4 and the source and drain wirings 10. Note that formation of the passivation film 11 is preferably performed following the plasma treatment in the mixed gas atmosphere of $H_2$ and Ar without exposure to the air from the plasma treatment.

Through the above-described process, a single-gate thin film transistor can be manufactured. By using the plasma treatment in a mixed gas atmosphere of $H_2$ and Ar at a pressure higher than 1000 Pa, the difference between the etching rate of the amorphous silicon film 5 and that of the microcrystalline silicon film 4 can be increased. Then, by utilizing this effect for channel etching in a manufacturing process of a thin film transistor, a single-gate thin film transistor with favorable electrical characteristics can be manufactured without decreasing the productivity.

Note that in this embodiment, a thin film transistor whose gate electrode is located only below a channel region has been described as a semiconductor device according to an embodiment of the present invention; however, the present invention may also be applied to a dual-gate thin film transistor whose back gate is located above a channel region as a semiconductor device according to an embodiment of the present invention.

This application is based on Japanese Patent Application serial no. 2010-271771 filed with Japan Patent Office on Dec. 6, 2010, the entire contents of which are hereby incorporated by reference.

What is claimed is:

1. An etching method comprising the step of:
   performing plasma treatment on an amorphous silicon film which is provided on a microcrystalline silicon film in a mixed gas atmosphere including $H_2$ and Ar at a pressure higher than 1000 Pa, so that the microcrystalline silicon film is exposed.

2. The etching method according to claim 1, wherein the amorphous silicon film is formed on and in direct contact with the microcrystalline silicon film.

3. The etching method according to claim 1, wherein the mixed gas atmosphere consists essentially of $H_2$ and Ar.

4. A manufacturing method of a thin film transistor, comprising the steps of:
   forming a microcrystalline silicon film over an insulating film;
   forming an amorphous silicon film on the microcrystalline silicon film; and
   performing plasma treatment on the amorphous silicon film in a mixed gas atmosphere including $H_2$ and Ar at a pressure higher than 1000 Pa, so that the microcrystalline silicon film is exposed.

5. The manufacturing method of a thin film transistor according to claim 4, wherein the amorphous silicon film is formed on and in contact with the microcrystalline silicon film.

6. The manufacturing method of a thin film transistor according to claim 4, wherein the mixed gas atmosphere consists essentially of $H_2$ and Ar.

7. The manufacturing method of a thin film transistor according to claim 4, wherein the insulating film is a silicon nitride film.

8. A manufacturing method of a thin film transistor, comprising the steps of:
   forming a gate electrode over a substrate;
   forming a gate insulating film over the gate electrode;
   forming a microcrystalline silicon film over the gate insulating film;
   forming an amorphous silicon film on the microcrystalline silicon film;
   forming an impurity silicon film over the amorphous silicon film;
   forming a conductive film over the impurity silicon film;
   forming a source wiring, a drain wiring, a source region, and a drain region by etching the conductive film and the impurity silicon film so that the amorphous silicon film is exposed; and
   after forming the source wiring, the drain wiring, the source region, and the drain region, performing plasma treatment on the amorphous silicon film which is exposed in a mixed gas atmosphere including $H_2$ and Ar at pressure higher than 1000 Pa, so that the microcrystalline silicon film is exposed.

9. The manufacturing method of a thin film transistor according to claim 8, further comprising the step of, after performing the plasma treatment, forming a passivation film over the source wiring, the drain wiring, and the microcrystalline silicon film which is exposed.

10. The manufacturing method of a thin film transistor according to claim 8, wherein the amorphous silicon film is formed on and in direct contact with the microcrystalline silicon film.

11. The manufacturing method of a thin film transistor according to claim 8, wherein the mixed gas atmosphere consists essentially of $H_2$ and Ar.

12. The manufacturing method of a thin film transistor according to claim 8, wherein the gate insulating film is a silicon nitride film.

13. The manufacturing method of a thin film transistor according to claim 8, wherein the impurity silicon film comprises phosphorus.

14. The manufacturing method of a thin film transistor according to claim 8, wherein the impurity silicon film has an n-type conductive type.

* * * * *